United States Patent
Revankar et al.

(10) Patent No.: US 11,690,199 B2
(45) Date of Patent: Jun. 27, 2023

(54) HEAT DISSIPATION ARRANGEMENT FOR BATTERY DISTRIBUTION UNIT

(71) Applicants: TE CONNECTIVITY CORPORATION, Berwyn, PA (US); TYCO ELECTRONICS BRASIL LTDA, Braganca Paulista (BR)

(72) Inventors: Shanoo Revankar, Winston Salem, NC (US); Amadeu Luiz Fazani Cavallieri, Campinas (BR); Jeremy Christin Patterson, Winston Salem, NC (US); David Bruce Sarraf, Elizabethtown, PA (US); Weiping Zhao, Superior Township, MI (US); Xiaobao Geng, Troy, MI (US)

(73) Assignees: TE Connectivity Brasil Industria De Eletronicos LTDA, Sao Paulo (BR); TE Connectivity Solutions GmbH, Schaffhausen (CH)

( * ) Notice: Subject to any disclaimer, the term of this patent is extended or adjusted under 35 U.S.C. 154(b) by 753 days.

(21) Appl. No.: 16/522,184

(22) Filed: Jul. 25, 2019

(65) Prior Publication Data

US 2021/0029846 A1    Jan. 28, 2021

(51) Int. Cl.
*H05K 7/20* (2006.01)
*H01H 45/14* (2006.01)
(Continued)

(52) U.S. Cl.
CPC .......... *H05K 7/2039* (2013.01); *H01H 45/14* (2013.01); *H01M 50/138* (2021.01); *H01H 1/62* (2013.01); *H01H 9/52* (2013.01); *H01H 13/28* (2013.01); *H01H 45/12* (2013.01); *H01H 50/12* (2013.01); *H01H 50/14* (2013.01); *H01M 10/425* (2013.01);
(Continued)

(58) Field of Classification Search
CPC ............ H05K 7/2039; H05K 7/20409; H05K 7/20418; H05K 7/20436; H05K 7/20472; H05K 7/20518; H05K 7/02; H01H 1/62; H01H 13/28; H01H 13/30; H01H 13/32; H01H 45/12; H01H 45/14; H01H 50/12; H01H 50/14; H01H 9/52; H01H 9/02; H01M 10/425; H01M 10/46; H01M 10/48; H01M 10/6551; H01M 10/6553; H01M 10/613; H01M 50/569; H01M 50/271–282; H01M 50/296; H01M 50/20; H01M 50/543; H01M 50/298; H01M 50/588; H01M 50/591; H01M 50/147; H01M 50/155; H01M 50/572;
(Continued)

(56) References Cited

U.S. PATENT DOCUMENTS

2017/0150630 A1 * 5/2017 Lyon ................... H01M 10/425

* cited by examiner

*Primary Examiner* — Matthew W Van Oudenaren (57) ABSTRACT

A battery distribution unit includes a housing having a bottom mounted to a battery case of a battery module and having a component cavity with a contactor therein. The contactor has fixed contacts having terminating ends extending from a bottom end of a contactor housing. The BDU includes terminals at the bottom end of the contactor coupled to the terminating ends and a heat exchanger cap at the bottom end of the contactor. The heat exchanger cap is provided in the component cavity in thermal communication with the fixed contacts and in thermal communication with the battery case of the battery module to dissipate heat from the fixed contacts into the battery case of the battery module.

26 Claims, 10 Drawing Sheets

(51) Int. Cl.
*H01M 50/138* (2021.01)
*H01M 10/6553* (2014.01)
*H01M 50/298* (2021.01)
*H01M 10/613* (2014.01)
*H01M 50/502* (2021.01)
*H01M 10/6551* (2014.01)
*H01H 13/28* (2006.01)
*H01H 9/52* (2006.01)
*H01M 50/591* (2021.01)
*H01H 50/14* (2006.01)
*H01M 10/42* (2006.01)
*H01H 50/12* (2006.01)
*H01H 45/12* (2006.01)
*H01M 50/588* (2021.01)
*H01H 1/62* (2006.01)

(52) U.S. Cl.
CPC ...... *H01M 10/613* (2015.04); *H01M 10/6551* (2015.04); *H01M 10/6553* (2015.04); *H01M 50/298* (2021.01); *H01M 50/502* (2021.01); *H01M 50/588* (2021.01); *H01M 50/591* (2021.01)

(58) Field of Classification Search
CPC ............. H01M 50/507; H01M 50/502; H01M 50/505; H01R 11/01; B60R 16/0238
See application file for complete search history.

HEAT DISSIPATION ARRANGEMENT FOR BATTERY DISTRIBUTION UNIT

BACKGROUND OF THE INVENTION

The subject matter herein relates generally to battery distribution units for battery modules.

Battery modules, such as for use in vehicles, include battery distribution units (BDUs) mounted thereto. The BDUs include circuit components, such as contactors, relays, fuses, bus bars, terminals, and the like. The BDUs control power distribution. The circuit components are held in a housing of the BDU and may be electrically connected to power inputs/outputs by wires, terminals, bus bars and the like. The circuit components experience temperature increase during use and may become very hot, such as during prolonged use, during high current situations, during short circuit situations, and the like. The circuit components may be damaged due to excessive heating. Due to the density of the BDU, it is difficult to provide heat dissipation, such as from heat sinks or by providing airflow over the circuit components due to the large number of circuit components and the tight spacing of the components within the housing.

A need remains for a battery distribution unit having an improved heat dissipation arrangement for circuit components of the battery distribution unit.

BRIEF DESCRIPTION OF THE INVENTION

In one embodiment, a battery distribution unit for a battery module is provided. The battery distribution unit includes a housing. The housing includes a bottom that is configured to be mounted to a battery case of the battery module. The housing includes a component cavity. A contactor is received in the component cavity. The contactor has a contactor housing that has a top end and a bottom end. The contactor defines a chamber. The contactor has a coil assembly in the chamber at the top end of the contactor housing. The coil assembly includes a coil and a plunger that is movable based on an operating state of the coil. The contactor has a movable contact in the chamber coupled to and movable with the plunger. The contactor has fixed contacts that are held by the contactor housing. Each fixed contact has a mating end and a terminating end. The mating end is positioned in the chamber and is configured to be engaged by the movable contact to close a contactor circuit of the contactor. The terminating end extends from the bottom end of the contactor housing. The battery distribution unit includes terminals at the bottom end of the contactor. The terminals are coupled to corresponding terminating ends of corresponding fixed contacts. The battery distribution unit includes a heat exchanger cap at the bottom end of the contactor. The heat exchanger cap is provided in the component cavity at the bottom of the housing. The heat exchanger cap is in thermal communication with the fixed contacts of the contactor and is configured to be in thermal communication with the battery case of the battery module to dissipate heat from the fixed contacts into the battery case of the battery module.

In a further embodiment, the contactor for a battery distribution unit of a battery module is provided. The contactor includes a contactor housing that extends between a top end and a bottom end. The contactor housing defines a chamber. The contactor housing has a bottom surface at the bottom end. The contactor includes a coil assembly in the chamber at the top end of the contactor housing that includes a coil and a plunger movable based on an operating state of the coil. The contactor includes a movable contact in the chamber coupled to and movable with the plunger. A first fixed contact has a mating end and a terminating end. The mating end is positioned in the chamber and is configured to be engaged by the movable contact. The terminating end extends from the bottom end of the contactor housing for electrical connection with a corresponding terminal. A second fixed contact has a mating end and a terminating end. The mating end is positioned in the chamber and is configured to be engaged by the movable contact to close a contactor circuit of the contactor defined by the first fixed contact and the second fixed contact. The terminating end extends from the bottom end of the contactor housing for electrical connection with a corresponding terminal. The contactor includes a heat exchanger cap at the bottom end of the contactor housing. The heat exchanger cap is in thermal communication with the first fixed contact. The heat exchanger cap is in thermal communication with the second fixed contact. The heat exchanger cap is configured to be in thermal communication with a battery case of the battery module to dissipate heat from the first and second fixed contacts into the battery case of the battery module.

In another embodiment, a battery distribution unit for a battery module is provided. The battery distribution unit includes a housing that has a bottom configured to be mounted to a battery case of the battery module. The housing includes a component cavity. A circuit component is received in the component cavity. The circuit component has a bottom surface facing the bottom of the housing. A heat spreader is in thermal communication with the bottom of the circuit component. The heat spreader is provided at or below the bottom of the housing and is configured to be in thermal communication with the battery case of the battery module to dissipate heat from the bottom of the circuit component into the battery case of the battery module.

DETAILED DESCRIPTION OF THE INVENTION

Figure 1:
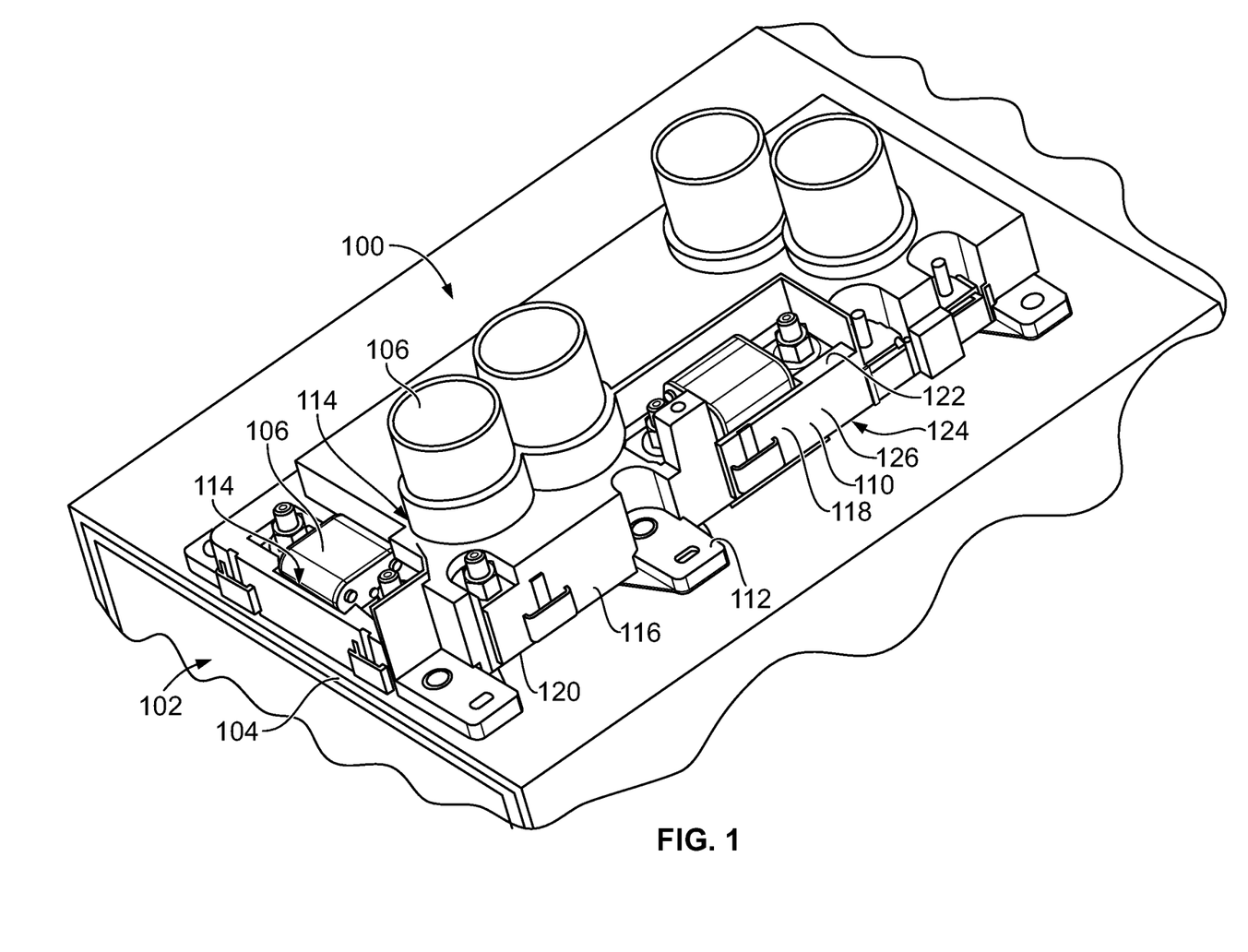
FIG. 1 is a top perspective view of a battery distribution unit (BDU) in accordance with an exemplary embodiment.
Figure 2:
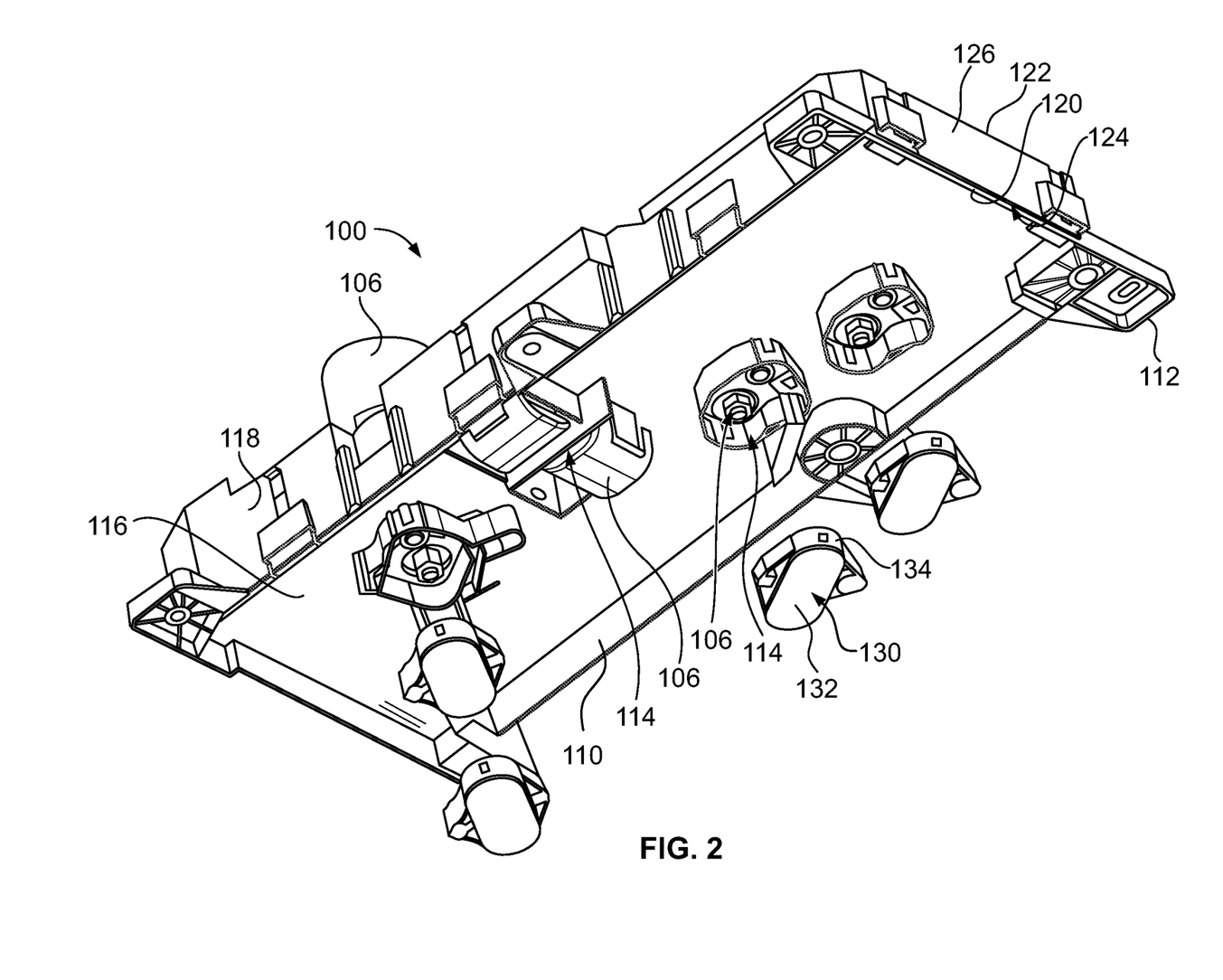
FIG. 2 is a bottom, partially exploded, perspective view of the BDU in accordance with an exemplary embodiment.

FIG. 1 is a top perspective view of a battery distribution unit (BDU) 100 in accordance with an exemplary embodiment. FIG. 2 is a bottom, partially exploded, perspective view of the BDU 100 in accordance with an exemplary embodiment. FIG. 1 illustrates the BDU 100 mounted to a battery module 102. The BDU 100 may be electrically connected to the battery module 102, such as to one or more battery terminals of the battery module 102.

In an exemplary embodiment, the BDU 100 is thermally coupled to the battery module 102 and uses a battery case 104 of the battery module 102 as a heat sink to dissipate heat from circuit components 106 of the BDU 100. The circuit components 106 are arranged in proximity to the battery case 104 to efficiently and reliably dissipate the heat generated by the circuit components 106 into the battery case 104. For example, hotspots of the circuit components 106 are located proximate to the battery case 104. In an exemplary embodiment, the BDU 100 includes heat spreaders or other thermal interface elements to create direct thermal paths between the circuit components 106 and the battery case 104 to efficiently transfer heat from the circuit components 106 into the battery case 104. In an exemplary embodiment, the battery case 104 is manufactured from a metal material that is highly thermally conductive. The battery case 104 has a large surface area for dissipating heat into the surrounding environment, such as directly into the air surrounding the battery module 102 or into a cooling system coupled to the battery module 102. The battery case 104 may include heat dissipating features, such as fins, posts, or other features extending therefrom to further increase the surface area of the battery case 104 to enhance cooling efficiency of the battery case 104.

The BDU 100 includes a housing 110 holding the circuit components 106. In an exemplary embodiment, different types of circuit components 106 may be held by the housing 110. For example, the circuit components 106 may include contactors, relays, fuses, electrical connectors, bus bars, terminals, and the like. Optionally, various circuit components 106 may be electrically connected by terminals, bus bars, wires, circuit boards, and the like.

In an exemplary embodiment, the housing 110 is configured to be mounted directly to the battery case 104. In various embodiments, the housing 110 includes mounting lugs 112 for mounting the housing 110 to the battery case 104, such as using fasteners. In an exemplary embodiment, the housing 110 includes a plurality of component cavities 114 receiving corresponding circuit components 106. The component cavities 114 may be open at the top and/or the bottom of the housing 110 to receive the circuit components 106. The component cavities 114 may have various shapes and sizes for receiving various different types of circuit components 106.

In an exemplary embodiment, the housing 110 is a multi-piece housing. For example, the housing 110 includes a base 116 and a cover 118 coupled to the base 116. The base 116 may hold various circuit components 106 and/or the cover 118 may hold various circuit components 106. For example, the base 116 includes corresponding component cavities 114 and the cover 118 includes corresponding component cavities 114. The base 116 is provided at a bottom 120 of the housing 110 and the cover 118 is provided at a top 122 of the housing 110. Optionally, the cover 118 may include a cavity 124 at a bottom of the cover 118 that receives a top of the base 116 such that at least a portion of the base 116 is received inside the cover 118. The cover 118 includes sidewalls 126 extending along portions of the base 116. The sidewalls 126 may be coupled to the base 116, such as using latches or other types of fasteners. The base 116 is configured to be mounted to the battery case 104, such as to a top of the battery case 104. In alternative embodiments, the housing 110 may be a single piece housing, rather than a multi-piece housing.

In an exemplary embodiment, the BDU 100 includes thermal interface elements 130 at the bottom 120 of the housing 110 associated with corresponding circuit components 106. The thermal interface elements 130 are configured to be coupled in direct thermal engagement with the corresponding circuit components 106. The thermal interface elements 130 include thermal interface surfaces 132 for directing heat away from the circuit components 106. Optionally, the thermal interface surfaces 132 may be planar surfaces. The thermal interface surfaces 132 may be coplanar with the bottom 120 of the housing 110 in various embodiments, such as for interfacing with the battery case 104. In other various embodiments, the thermal interface surfaces 132 of the thermal interface elements 130 may be located below (for example, project from) the bottom 120 of the housing 110, such as for interfacing with the battery case 104. The thermal interface surfaces 132 may be in direct thermal contact with a heat sink, such as the battery case 104, when the BDU 100 is mounted to the battery case 104. However, in other various embodiments, another component, such as a heat sink plate (not shown) or another type of heat spreader may be used as an interposer between the thermal interface elements 130 and the battery case 104.

In the illustrated embodiment, the thermal interface elements 130 include heat exchanger caps 134 configured to be coupled to the bottom 120 of the housing 110. The heat exchanger caps 134 are configured to directly engage hotspots of the circuit components 106 to dissipate heat from the circuit components 106, such as directly to the battery case 104. In the illustrated embodiment, the heat exchanger caps 134 are configured to be coupled to fixed contacts of contactors defining the corresponding circuit components 106. For example, the contactors are arranged in a vertical orientation with the fixed contacts at the distal end of the contactors extending through the bottom 120 of the housing 110 to interface with the heat exchanger caps 134. The fixed contacts are the heat generating components of the contactors and thus define hotspots of the contactors. The heat exchanger caps 134 are directly thermally coupled to the hotspots of the contactors at the bottom 120 of the housing 110 to efficiently pull the heat from the contactors and transfer the heat to the battery case 104 where the heat may be efficiently dissipated by the large surface area battery case 104.

Figure 3:
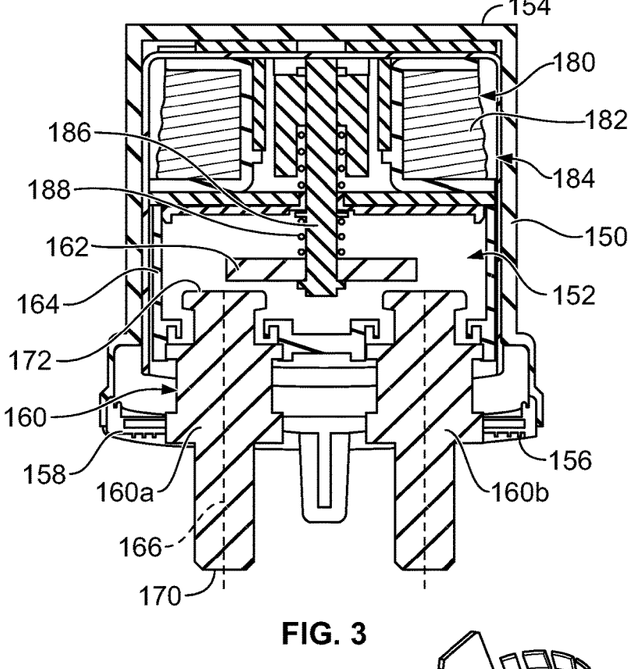
FIG. 3 is a cross-sectional view of a circuit component of the BDU in accordance with an exemplary embodiment.

FIG. 3 is a cross-sectional view of a circuit component 106 in accordance with an exemplary embodiment. In an exemplary embodiment, the circuit component 106 is a contactor 140, such as an electrical switch or relay that safely connects and disconnects one or more electrical circuits to protect the flow of power through a circuit.

The contactor 140 includes a contactor housing 150 having a cavity 152. The contactor housing 150 may be a multi-piece housing in various embodiments. The contactor housing 150 extends between a top end 154 and a bottom end 156. The contactor housing 150 includes a cover 158 for closing the cavity 152. For example, the cover 158 may be provided at the bottom end 156. Optionally, the cover 158 may be sealed to an outer wall of the contactor housing 150. In various embodiments, the outer wall of the contactor housing 150 may be cylindrical defining a cylindrical cavity 152.

The contactor 140 includes fixed contacts 160 received in the cavity 152 and a movable contact 162 movable within the cavity 152 between a mated position and an unmated position. The movable contact 162 engages the fixed contacts 160 to electrically connect the fixed contacts 160 in the mated position to close a contactor circuit of the contactor 140. In the illustrated embodiment, the contactor 140 includes first and second fixed contacts 160a, 160b. The fixed contacts 160 are fixed to the contactor housing 150. For example, the fixed contacts 160 may be coupled to the cover 158. In various embodiments, the fixed contacts 160 may be coupled to an insert 164 of the contactor housing 150 inserted into the cavity 152. Each fixed contact 160 extends along a fixed contact axis 166. The movable contact 162 is movable in a direction parallel to the fixed contact axis 166. In an exemplary embodiment, the fixed contact axis 166 has a vertical orientation.

The fixed contacts 160 each include a terminating end 170 and a mating end 172. The terminating end 170 is configured to be terminated to another component, such as a terminal (for example, a bus bar or a terminal provided at an end of a wire, such as a line in or a line out wire). The terminating end 170 is exposed at the exterior of the contactor 140 for terminating to the other component. In an exemplary embodiment, the terminating end extends below the bottom end 156 of the contactor housing 150 for termination to the terminal. The terminating end 170 may be threaded to receive a nut. In the illustrated embodiment, the terminating end 170 extends through the cover 158 and is located below the cover 158. The mating end 172 is located within the cavity 152 for mating engagement with the movable contact 162, such as when the contactor 140 is energized. In the illustrated embodiment, the mating end 172 is generally flat for engaging the movable contact 162. However, the mating end 172 may have other shapes in alternative embodiments, such as a rounded shape to form a mating bump at the mating end 172 for mating with the movable contact 162. When the movable contact 162 is mated with the fixed contacts 160, the contactor circuit is closed and power flows through the contactor circuit generating heat in the movable contact 162 and the fixed contacts 160. The terminating ends 170 of the fixed contacts 160 extend below the bottom end 156 of the contactor housing 150 to position the terminating ends 170 in close proximity to the battery case 104 (shown in FIG. 1) to dissipate heat from the fixed contacts 160.

The contactor 140 includes a coil assembly 180 in the cavity 152, such as at the top end 154 of the contactor housing 150. The coil assembly 180 is operated to move the movable contact 162 between the unmated position and the mated position. The coil assembly 180 includes a winding or coil 182 wound around a core 184 to form an electromagnet. The coil assembly 180 includes a plunger 186 coupled to the core 184. The movable contact 162 is coupled to the plunger 186 and is movable with the plunger 186 when the coil assembly 180 is operated. The coil assembly 180 includes a spring 188 for returning the movable contact 162 to the unmated position when the coil assembly 180 is deenergized.

Figure 4:
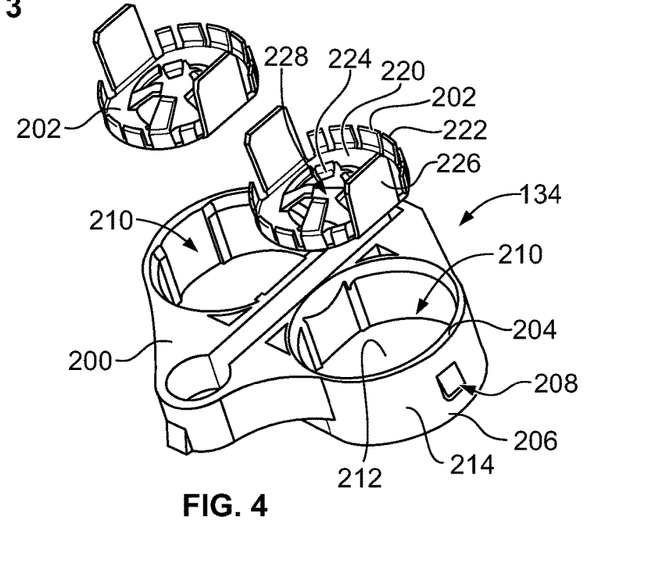
FIG. 4 is a top perspective, exploded view of a heat exchanger cap of the BDU in accordance with an exemplary embodiment.

FIG. 4 is a top perspective, exploded view of the heat exchanger cap 134 in accordance with an exemplary embodiment. The heat exchanger cap 134 includes a cap body 200 and heat spreaders 202 received in the cap body 200. In an exemplary embodiment, the cap body 200 is manufactured from an electrically insulative material that is thermally conductive. For example, the cap body 200 may be manufactured from a ceramic material. In other various embodiments, the cap body 200 may be manufactured from a silicone rubber material or a composite, such as an epoxy resin with boron nitride or aluminum nitride fillers. The cap body 200 provides electrical isolation between the circuit component 106 and the battery case 104 or other circuit components 106 while having a thermal conductivity of greater than 3.0 Btu ft/hr F. The cap body 200 includes a top 204 and a bottom 206. The cap body 200 includes latching features 208 used for securing the heat exchanger cap 134 in the housing 110 (shown in FIG. 1) of the BDU 100 (shown in FIG. 1).

The cap body 200 includes pockets 210 that receive the heat spreaders 202. In the illustrated embodiment, the pockets 210 include openings at the top 204. The pockets 210 may additionally or alternatively include openings at the bottom 206. In an exemplary embodiment, the cap body 200 includes a housing member 214 defining the pockets 210 that holds the heat spreaders 202 and pads 212 at the bottom ends of the pockets 210. The pads 212 are provided at the bottom 206 of the housing member 214 of the cap body 200. The heat spreaders 202 are configured to be mounted to the pads 212 and may transfer heat into the pads 212. The pads 212 may define the thermal interface surfaces 132 at the bottom 206 for dissipating heat into the heat sink defined by the battery case 104 (shown in FIG. 1). For example, the pads 212 are configured to be thermally coupled to the heat spreaders 202 and the pads 212 are used to transfer to the battery case 104.

In various embodiments, the pads 212 and the housing member 214 are integral with each other to form the cap body 200. The pads 212 and the housing member 214 may both be made from the same material, such as being molded together as part of a single molded piece. In other alternative embodiments, the pads 212 are separate and discrete pieces from the housing member 214 of the cap body 200 and are coupled to the housing member 214. For example, the housing member 214 may be a structural element that holds the pads 212 and the heat spreaders 202. The pads 212 may be manufactured from a different material than the housing member 214. For example, the pads 212 are used as the primary heat transfer, thus the housing member 214 may be manufactured from a less expensive material than the pads 212. The pads 212 may be manufactured from a material that is more thermally conductive than the material of the housing member 214. In various embodiments, the cap body 200 is manufactured in a two-shot molding process using two different resins for the housing member 214 and the pads 212. In other various embodiments, the housing member 214 and the pads 212 may be separately manufactured, such as separately molded, and then assembled together, such as by snap coupling together, latching together, adhering together or being laser welded together.

In an exemplary embodiment, the heat spreader 202 is manufactured from a thermally conductive material, such as a metal material. For example, the heat spreader 202 may be stamped and formed from a metal sheet of copper or other metal. The heat spreader 202 includes a base 220, fins 222 extending from the base 220, and spring fingers 224 extending from the base 220. The base 220 is mounted to the pad 212. The base 220 directly engages the pad 212 and is in thermal communication with the pad 212. Heat is transferred from the base 220 of the heat spreader 202 to the pad 212. The fins 222 extend upward from the base 220 and are configured to engage sidewalls defining the pockets 210. The fins 222 directly engage the cap body 200 to transfer heat from the heat spreader 202 to the cap body 200. The fins 222 may be deflectable and spring biased against the cap body 200. In an exemplary embodiment, the heat spreader 202 includes mounting tabs 226 extending from the base 220 for mounting the heat spreader 202 to the cap body 200. The mounting tabs 226 may engage the cap body 200 and may transfer heat from the heat spreader 202 to the cap body 200.

The spring fingers 224 extend from the base 220 and are configured to engage the circuit component 106, such as the contactor 140 (shown in FIG. 3). For example, the spring fingers 224 may directly engage the terminating end 170 of the fixed contact 160 (shown in FIG. 3). The spring fingers 224 are deflectable and configured to be spring biased against the fixed contact 160. The spring fingers 224 have interfaces, such as at distal ends thereof for direct thermal contact between the heat spreader 202 and the fixed contact 160. In the illustrated embodiment, the spring fingers 224 are located near a center of the base 220 and the fins 222 are located near an outer perimeter of the base 220; however, other positions are possible in alternative embodiments. In the illustrated embodiment, the spring fingers 224 are disposed around an opening 228 in the base 220 and extend generally radially inward toward the center of the base 220. Other locations are possible in alternative embodiments.

Figure 5:
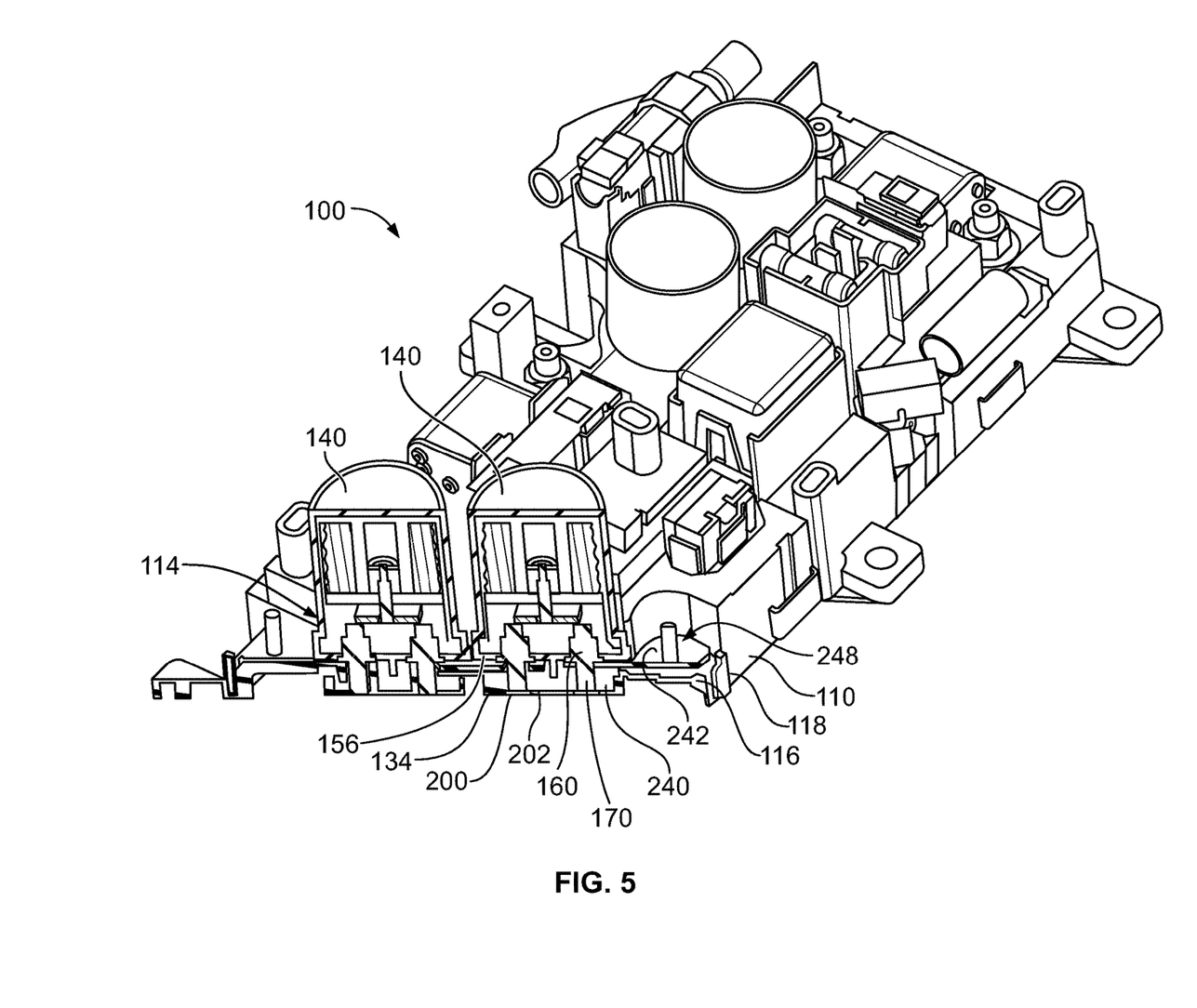
FIG. 5 is a cross-sectional view of a portion of the BDU in accordance with an exemplary embodiment.
Figure 6:
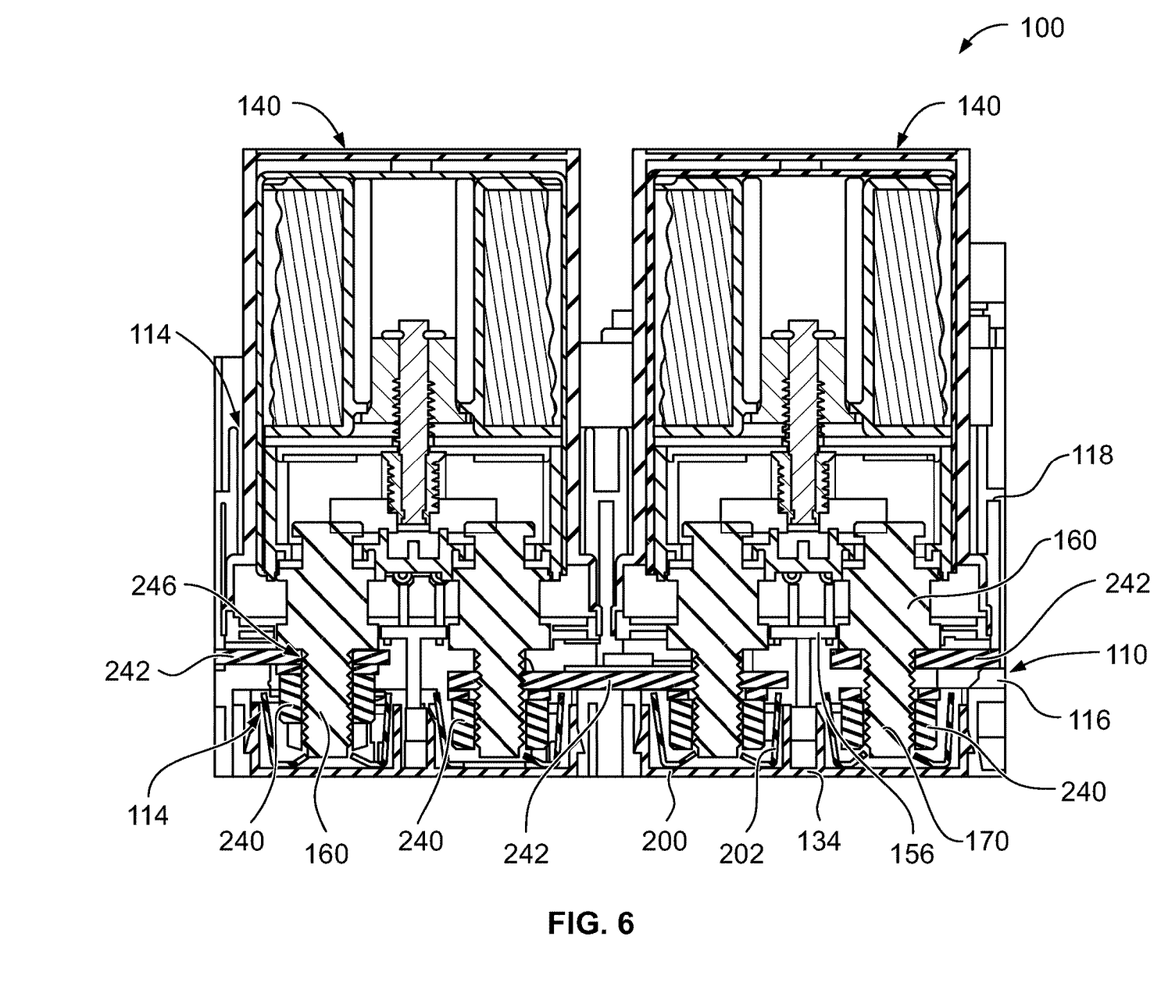
FIG. 6 is an enlarged, cross-sectional view of a portion of the BDU in accordance with an exemplary embodiment.

FIG. 5 is a cross-sectional view of a portion of the BDU 100 in accordance with an exemplary embodiment. FIG. 6 is an enlarged cross-sectional view of a portion of the BDU 100 in accordance with an exemplary embodiment. FIGS. 5 and 6 illustrate a pair of the contactors 140 held in corresponding component cavities 114 in the housing 110. In an exemplary embodiment, the contactors 140 are held in corresponding component cavities 114 in the cover 118. The terminating ends 170 of the fixed contacts 160 extend below the bottom end 156 into the corresponding component cavities 114 and the base 116. The terminating ends 170 extend into the heat exchanger caps 134. In an exemplary embodiment, the heat spreaders 202 mechanically and thermally engage the terminating ends 170 of the fixed contacts 160 to dissipate heat into the cap body 200, where the heat may be transferred away from the heat exchanger caps 134 into the battery case 104.

In an exemplary embodiment, nuts 240 are threadably coupled to the terminating ends 170 of the fixed contacts 160 to mechanically and electrically connect the fixed contacts 160 to corresponding terminals 242. In the illustrated embodiment, the terminals 242 are bus bars 244 having openings 246 receiving the terminating ends 170 of the fixed contacts 160. The terminals 242 are held in the housing 110. One of the bus bars 244 extends between corresponding fixed contacts 160 of the pair of contactors 140 to electrically connect the contactors 140. The other bus bars 244 extend to ports 248 for electrical connection to other components, such as wires, power terminals, power connectors, or other components.

Figure 7:
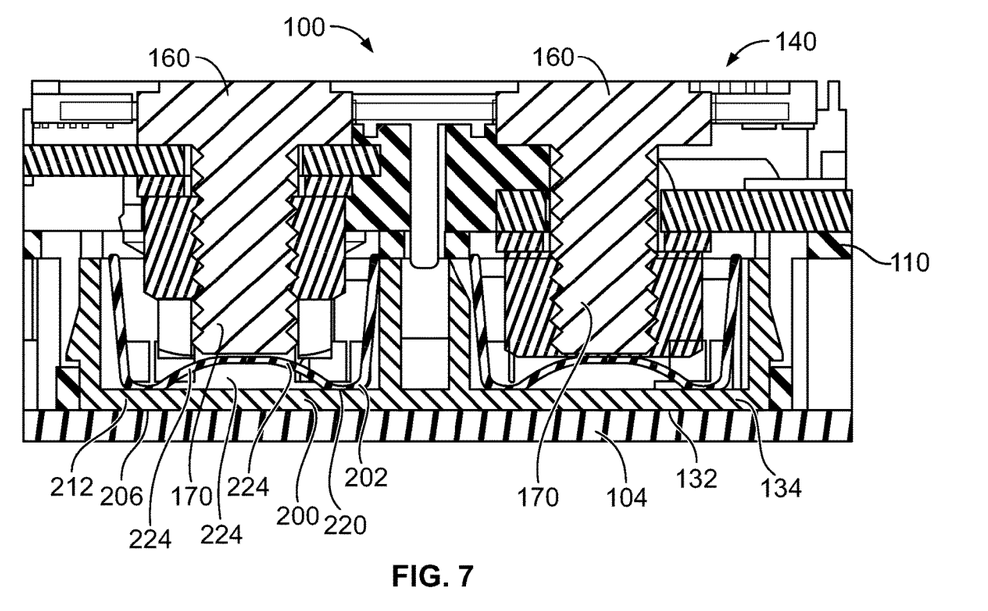
FIG. 7 is an enlarged, cross-sectional view of a portion of the BDU in accordance with an exemplary embodiment.

FIG. 7 is an enlarged cross-sectional view of a portion of the BDU 100 in accordance with an exemplary embodiment. In an exemplary embodiment, the heat spreaders 202 mechanically and thermally engage the terminating ends 170 of the fixed contacts 160. The spring fingers 224 are compressed against the fixed contacts 160 to directly thermally engage the fixed contacts 160. The heat exchanger caps 134, via the spring fingers 224 of the heat spreaders 202, are spring loaded against the fixed contacts 160 and the housing 110. The deflection of the spring fingers 224 take up tolerances or slack in the positioning of the heat exchanger caps 134 relative to the housing 110 and/or the positioning of the contactors 140 relative to the housing 110. When the spring fingers 224 are compressed by the fixed contacts 160, the base 220 of the heat spreader 202 is driven downward into physical and thermal contact with the pad 212 of the cap body 200. A thermal flow path is formed from the fixed contact 160 to the cap body 200 through the heat spreader 202. In an exemplary embodiment, the thermal interface surface 132 at the bottom 206 of the cap body 200 is configured to directly engage the battery case 104 such that the battery case 104 pulls the heat from the cap body 200 and from the heat spreader 202 to cool the fixed contacts 160. In other various embodiments, a thermal interface element, such as a heat sink plate may be provided between the bottom 206 of the cap body 200 and the top surface of the battery case 104.

Figure 8:
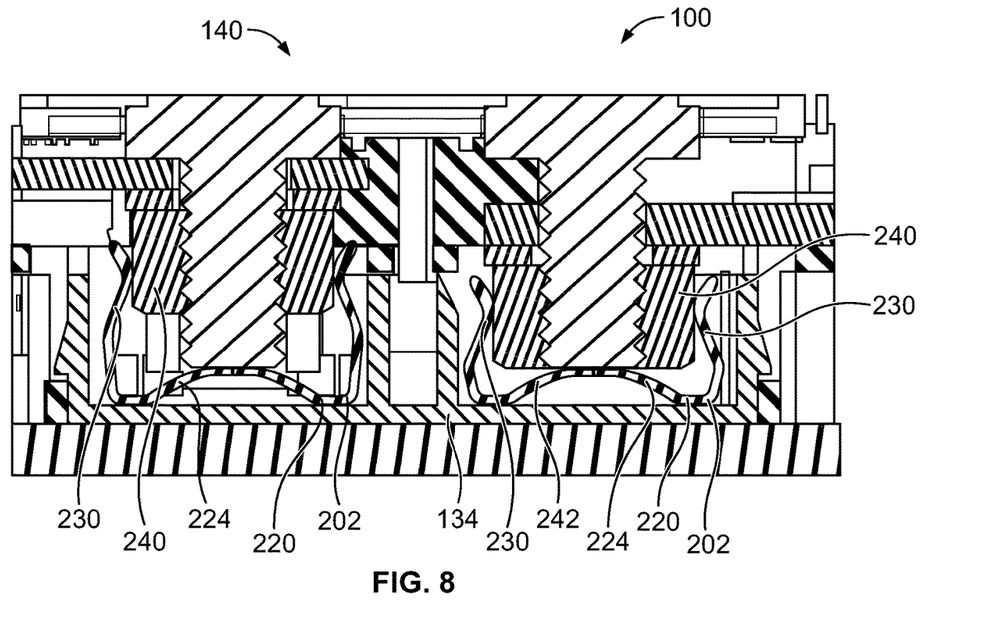
FIG. 8 is an enlarged, cross-sectional view of a portion of the BDU in accordance with an exemplary embodiment.

FIG. 8 is an enlarged cross-sectional view of a portion of the BDU 100 in accordance with an exemplary embodiment. FIG. 8 illustrates the heat spreader 202 including outer spring fingers 230 around the outer perimeter of the base 220 configured to engage and thermally couple to the nut 240. The outer spring fingers 230 create an additional thermal transfer path from the contactor 140 to the heat exchanger cap 134, such as through the base of the heat spreader 202. The outer spring fingers 230 may have a large surface area configured to engage the flat surface of the nut 240 for efficient thermal transfer between the nut 240 and the heat spreader 202. The outer spring fingers 230 may be provided in addition to, or in the alternative to, the spring fingers 224.

Figure 9:
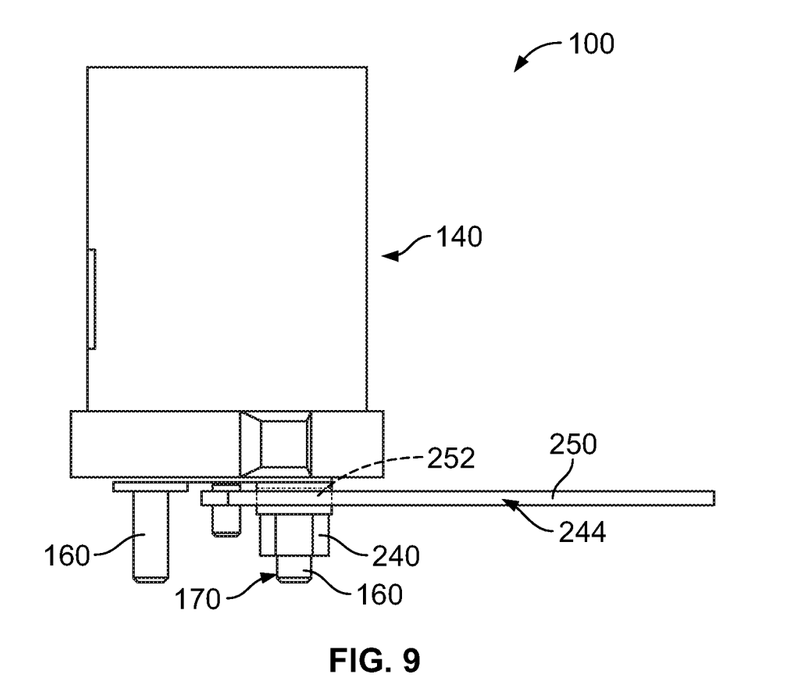
FIG. 9 is a side view of a portion of the BDU showing the contactor coupled to a bus bar in accordance with an exemplary embodiment.
Figure 10:
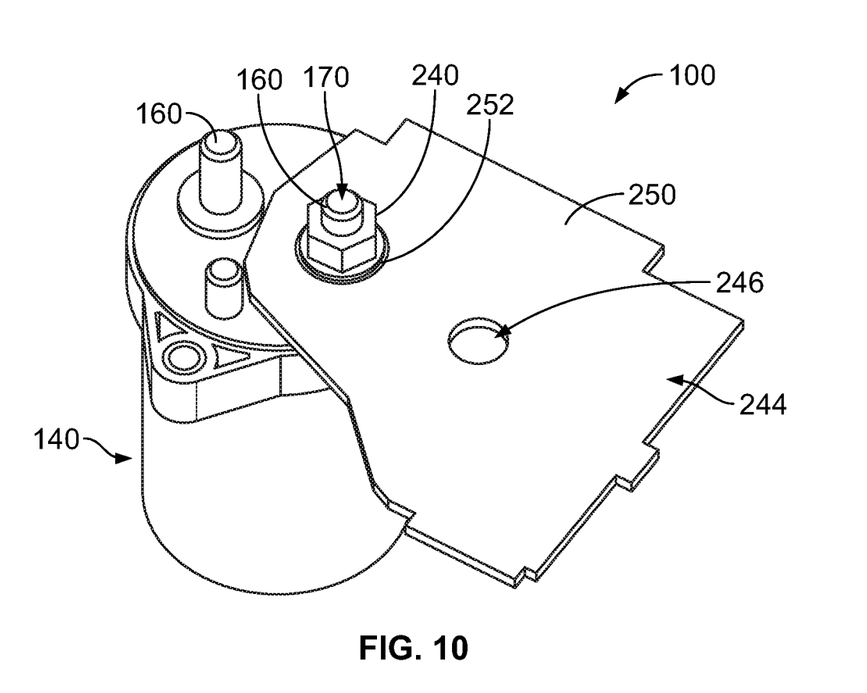
FIG. 10 is a bottom perspective view of a portion of the BDU showing the contactor coupled to the bus bar in accordance with an exemplary embodiment.
Figure 11:
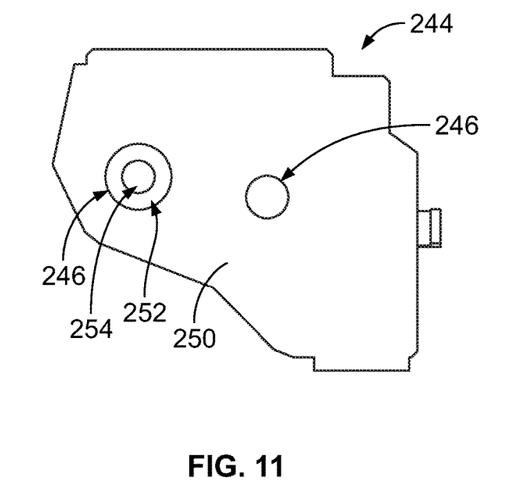
FIG. 11 is a top view of the bus bar in accordance with an exemplary embodiment.

FIG. 9 is a side view of a portion of the BDU 100 showing the contactor 140 coupled to the bus bar 244 in accordance with an exemplary embodiment. FIG. 10 is a bottom perspective view of a portion of the BDU 100 showing the contactor 140 coupled to the bus bar 244 in accordance with an exemplary embodiment. FIG. 11 is a top view of the bus bar 244 in accordance with an exemplary embodiment. The terminating ends 170 of the fixed contacts 160 of the contactor 140 are mechanically and electrically connected to the bus bar 244 using the nuts 240.

In an exemplary embodiment, the bus bar 244 includes a plate 250 having the openings 246 that receive the terminating end 170 of the fixed contact 160 or other components. The plate 250 is manufactured from a metal material, such as aluminum or copper. In an exemplary embodiment, the plate 250 is an aluminum plate and includes a copper button 252 pressed into the plate 250 at the opening 246. The button 252 includes an opening 254 that receives the terminating end 170 of the fixed contact 160. The button 252 has top and bottom surfaces that may be flush with the top and bottom surfaces of the plate 250. In the illustrated embodiment, the button 252 has a circular shape; however, the button 252 may have any shape in alternative embodiments. Manufacturing the plate 250 from aluminum, as opposed to copper, reduces weight of the bus bar 244 and material cost of the bus bar 244. The copper button 252, at the interface with the fixed contact 160, provides a robust interface between the fixed contact 160 and the plate 250. Manufacturing the button 252 from copper, as opposed to aluminum, provides better mechanical retention between the fixed contact 160 and the bus bar 244. Additionally, the copper button 252 is less susceptible to corrosion at the interface with the fixed contact 160.

Figure 12:
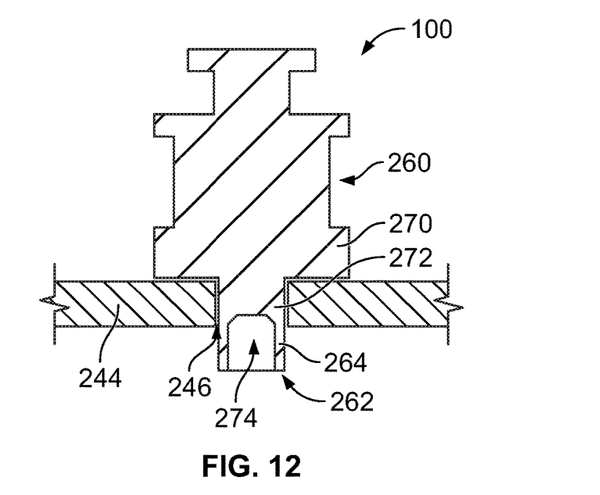
FIG. 12 is a side, partial sectional view of a portion of the BDU showing a fixed contact of the contactor coupled to the bus bar in accordance with an exemplary embodiment.
Figure 13:
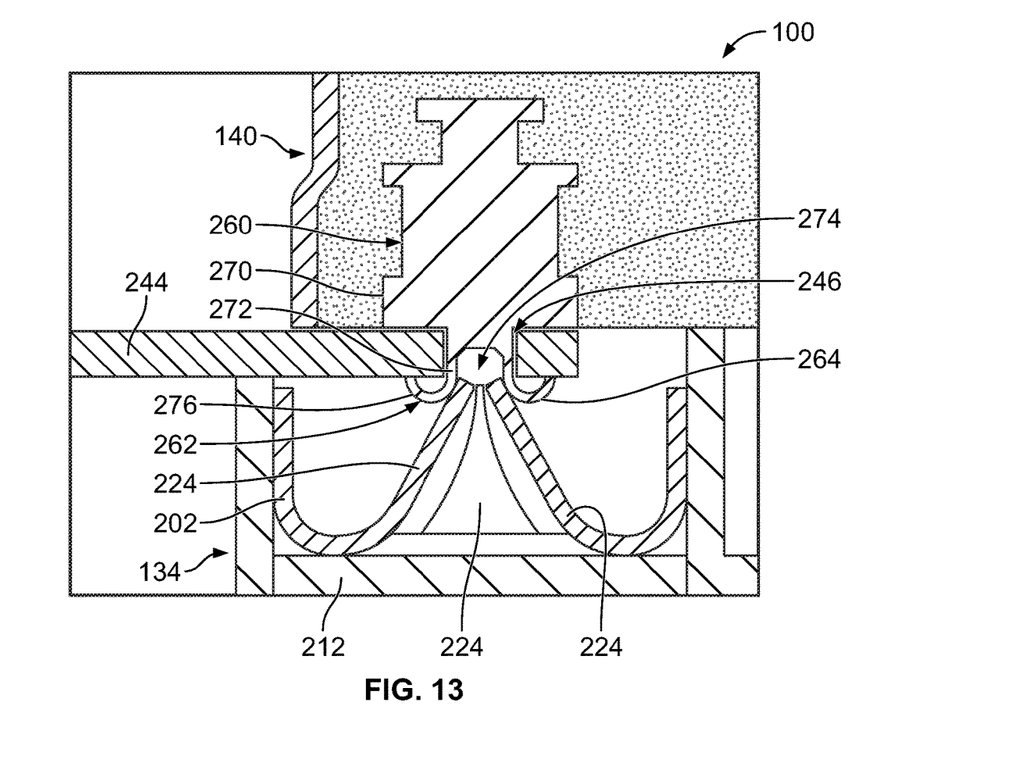
FIG. 13 is a side, partial sectional view of a portion of the BDU showing the fixed contact of the contactor coupled to the bus bar in accordance with an exemplary embodiment.

FIG. 12 is a side, partial sectional view of a portion of the BDU 100 showing a fixed contact 260 of the contactor 140 coupled to the bus bar 244 in accordance with an exemplary embodiment. FIG. 13 is a side, partial sectional view of a portion of the BDU 100 showing the fixed contact 260 of the contactor 140 coupled to the bus bar 244. The fixed contact 260 is similar to the fixed contact 160 (shown in FIG. 3); however, the fixed contact 260 is configured to be press-fit to the bus bar 244, such as being riveted to the bus bar 244, rather than being threadably coupled to the bus bar 244. The heat exchanger cap 134 is illustrated in FIG. 13 with the heat spreader 202 thermally coupled to the fixed contact 260 in accordance with an exemplary embodiment.

A terminating end 262 of the fixed contact 260 includes a rivet 264 configured to be coupled to the bus bar 244. The rivet 264 includes a head 270 and a rivet stem 272 extending from the head 270 through the opening 246 in the bus bar 244. The rivet stem 272 has a recess 274. The rivet stem 272 is configured to be deformed, such as using a tool, to form a locking collar 276 (FIG. 13) to secure the rivet 264 to the bus bar 244. For example, the rivet stem 272 may be rolled or pressed outward to form the locking collar 276. The bus bar 244 is captured between the head 270 and the locking collar 276 to mechanically and electrically connect the fixed contact 260 to the bus bar 244.

The heat exchanger cap 134 is directly thermally coupled to the fixed contact 260 to efficiently pull the heat from the hotspot of the contactor 140 and transfer the heat from the fixed contact 260 to the battery case 104 (shown in FIG. 1) where the heat may be efficiently dissipated by the large surface area battery case 104. The heat spreaders 202 mechanically and thermally engage the terminating end 262 of the fixed contact 260 to dissipate heat into the pad 212, where the heat may be transferred away from the heat exchanger cap 134 into the battery case 104. The heat spreaders 202 may be shaped to interface with the terminating end 262 of the fixed contact 260, such as to interface with the locking collar 276. The spring fingers 224 may directly engage the locking collar 276, such as to the outside of the locking collar 276 and/or to the interior of the rivet stem 272 in the recess 274. The spring fingers 224 are deflectable and configured to be spring biased against the fixed contact 260, such as to the locking collar 276. The spring fingers 224 have interfaces, such as at distal ends for direct thermal contact between the heat spreader 202 and the fixed contact 260.

Figure 14:
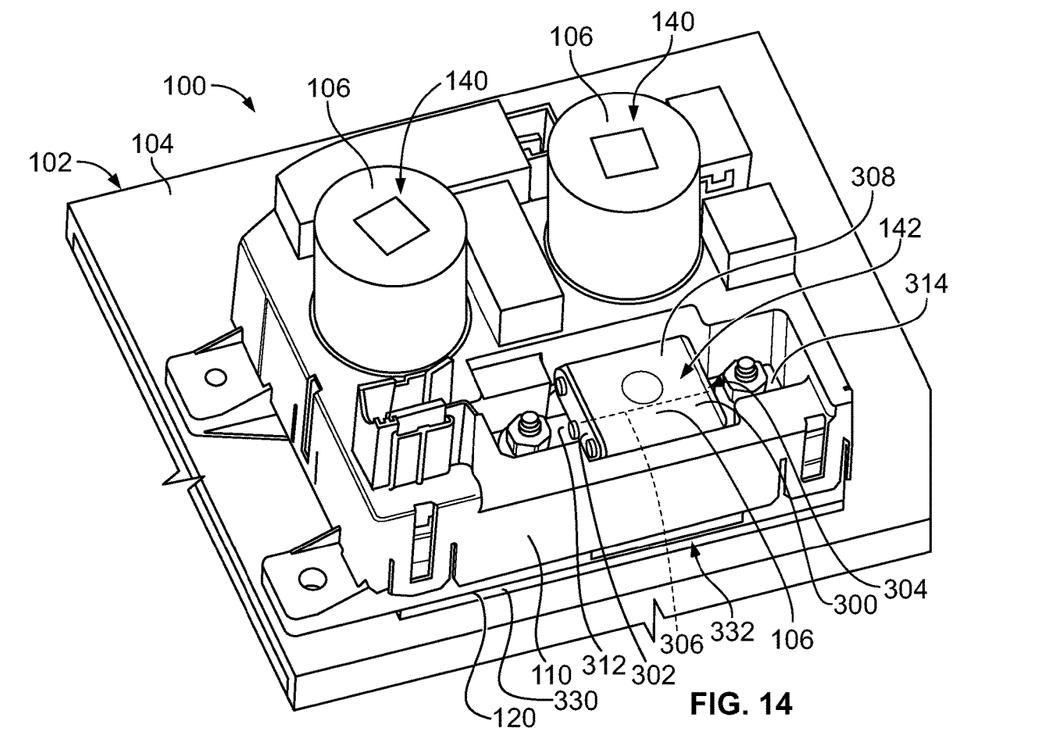
FIG. 14 is a top perspective view of a portion of the BDU in accordance with an exemplary embodiment.

FIG. 14 is a top perspective view of a portion of the BDU 100 in accordance with an exemplary embodiment. The BDU 100 includes the contactors 140. In an exemplary embodiment, the circuit components 106 of the BDU 100 include a fuse 142. The fuse 142 includes a fuse body 300 extending between a first end 302 and a second end 304. The fuse 142 has a fuse element 306 (shown in phantom) between the first end 302 and the second end 304. In the illustrated embodiment, the fuse body 300 is rectangular having flat walls 308, such as along the sides, top and bottom. The fuse body 300 may have other shapes in alternative embodiments. The fuse 142 has a first fuse contact 312 at the first end 302 and a second fuse contact 314 at the second end 304. The fuse contacts 312, 314 are coupled to terminals, bus bars or other components, such as using nuts.

In an exemplary embodiment, the BDU 100 includes a thermal interface element 330 at the bottom 120 of the housing 110. In the illustrated embodiment, the thermal interface element 330 is a heat spreader including a heat sink plate 332. The heat sink plate 332 is located below the housing 110, such as between the circuit components 106 and the battery case 104 of the battery module 102. In an exemplary embodiment, the heat sink plate 332 is located below the contactors 140 and the fuse 142. The heat sink plate 332 is used to dissipate heat from the circuit components 106, such as into the battery case 104.

Figure 15:
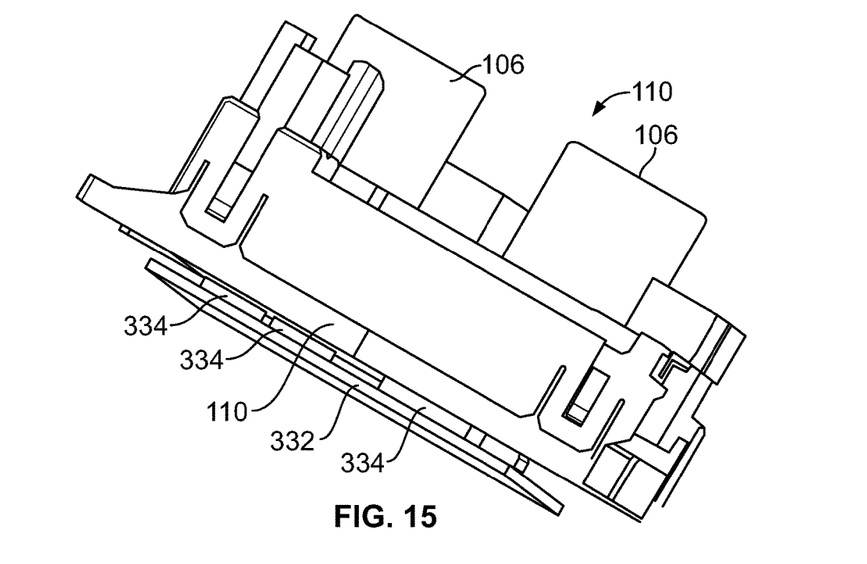
FIG. 15 is a side perspective view of the BDU in accordance with an exemplary embodiment.
Figure 16:
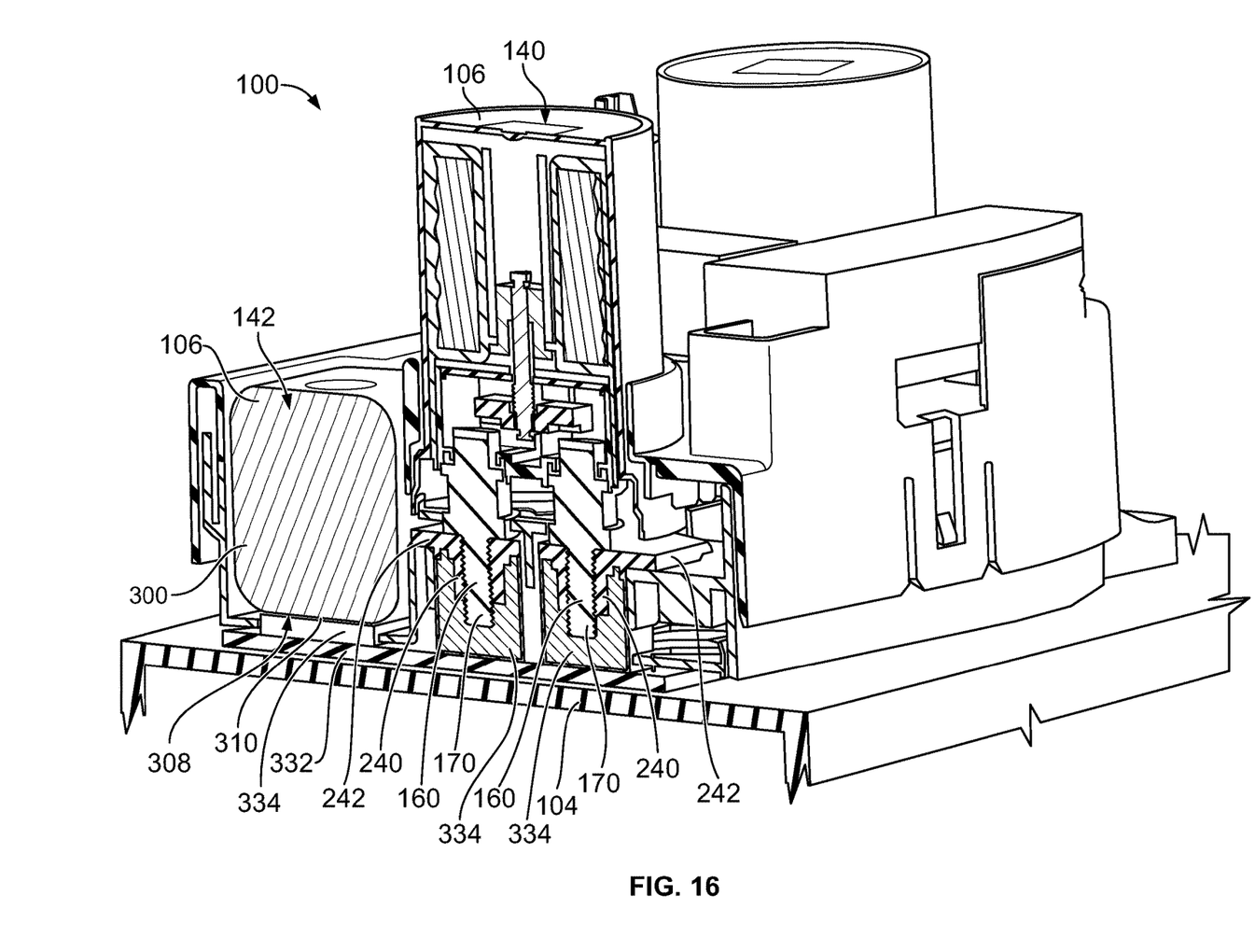
FIG. 16 is a cross-sectional view of the BDU in accordance with an exemplary embodiment.

FIG. 15 is a side perspective view of the BDU 100 in accordance with an exemplary embodiment. FIG. 15 illustrates the heat sink plate 332 below the housing 110. In an exemplary embodiment, thermal interface elements 334 are provided between the circuit components 106 and the heat sink plate 332. The heat sink plate may be a metal plate having an upper surface and a lower surface. The thermal interface elements 334 directly engage the upper surface and the lower surface is configured to directly engage the battery case 104. In various embodiments, the thermal interface elements 334 may be thermal foam, thermal pads, and the like. In other various embodiments, the heat sink plate 332 may be directly coupled to the circuit components 106 rather than having the intermediary thermal interface elements 334. FIG. 16 is a cross-sectional view of the BDU 100 in accordance with an exemplary embodiment. FIG. 16 illustrates the thermal interface elements 334 between the heat sink plate 332 and the circuit components 106. The thermal interface elements 334 directly engage the heat sink plate 332 and directly engage the corresponding circuit components 106 to thermally couple the circuit components 106 to the heat sink plate 332. Heat is dissipated to the battery case 104 through the heat sink plate 332 and through the thermal interface elements 334.

In an exemplary embodiment, at the thermal interface with the contactor 140, the thermal interface elements 334 directly engage the terminating ends 170 of the fixed contacts 160 and/or directly engage the nuts 240 and/or directly engage the terminals 242 to thermally couple to the contactor 140. The thermal interface elements 334 may be compressible against the surfaces of the fixed contacts 160, the nuts 240, and/or the terminals 242. The thermal interface elements 334 may be compressible against the heat sink plate 332. The thermal interface elements 334 and the heat sink plate 332 are used to dissipate heat from the fixed contacts 160 into the battery case 104. In other various embodiments, the thermal interface elements 334 may be held in heat exchanger caps (not shown), such as the heat exchanger caps 134 (shown in FIG. 2), rather than being free standing in the component cavities 114 of the housing 110.

In an exemplary embodiment, at the thermal interface with the fuse 142, the thermal interface element 334 directly engages a bottom surface 310 of the bottom wall 308 of the fuse 142. The thermal interface element 334 may be compressible against the bottom surface 310 of the fuse 142. The thermal interface element 334 may be compressible against the heat sink plate 332. The thermal interface element 334 and the heat sink plate 332 are used to dissipate heat from the fuse body 300 into the battery case 104.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A battery distribution unit for a battery module comprising:
   a housing including a bottom configured to be mounted to a battery case of the battery module, the housing including a component cavity;
   a contactor received in the component cavity, the contactor having a contactor housing having a top end and a bottom end, the contactor including a movable contact in the contactor housing movable relative to fixed contacts to create an electrical switch that connects and disconnects the fixed contacts;
   terminals at the bottom end of the contactor housing, the terminals coupled to terminating ends of the fixed contacts; and
   a heat exchanger cap at the bottom end of the contactor housing, the heat exchanger cap provided in the component cavity at the bottom of the housing, the heat exchanger cap in direct thermal communication with the fixed contacts and configured to be in thermal communication with the battery case of the battery module to dissipate heat from the fixed contacts into the battery case of the battery module.

2. The battery distribution unit of claim 1, wherein the heat exchanger cap includes spring fingers compressed against the fixed contacts to directly thermally engage the fixed contacts.

3. The battery distribution unit of claim 1, wherein the heat exchanger cap includes a cap body including pockets receiving terminating ends of the fixed contacts, the heat exchanger cap includes heat spreaders received in the pockets, the heat spreaders defining direct thermal interfaces between the fixed contacts and the cap body.

4. The battery distribution unit of claim 3, wherein each heat spreader includes a base and spring fingers extending from the base, the base directly engaging the cap body, the spring fingers directly engaging the fixed contacts.

5. The battery distribution unit of claim 4, wherein each heat spreader includes fins extending from the base engaging a nut threadably coupled to a corresponding fixed contact.

6. The battery distribution unit of claim 3, wherein the cap body includes a housing member defining the pockets and pads at bottoms of the pockets, the pads being manufactured from a first material, the housing member manufactured from a second material different than the first material, the first material being more thermally conductive than the second material.

7. The battery distribution unit of claim 1, wherein the heat exchanger cap is positioned axially in line between the contactor and the battery case of the battery module.

8. The battery distribution unit of claim 1, wherein each fixed contact extends along a fixed contact axis between a mating end and a terminating end, the fixed contact axis being perpendicular to the battery case in a vertical orientation.

9. The battery distribution unit of claim 1, wherein the terminating ends of the fixed contacts are portions of the contactor closest to the battery case of the battery module, the heat exchanger cap being disposed between the terminating ends of the fixed contacts and the battery case of the battery module.

10. The battery distribution unit of claim 1, wherein a terminating end of each fixed contact includes a rivet including a locking collar riveted to a terminal.

11. The battery distribution unit of claim 1, further comprising a heat spreader positioned between the terminating ends of the fixed contacts and the battery case of the battery module in thermal communication between the fixed contacts and the battery case to dissipate heat from the fixed contacts into the battery case.

12. The battery distribution unit of claim 1, wherein the heat exchanger cap is spring loaded against at least one of the housing and the fixed contacts.

13. The battery distribution unit of claim 1, wherein the housing includes a base and a cover coupled to the base, the base defining the bottom of the housing, the cover defining a top of the housing, the component cavity extending through the base and the cover, the contactor received in the cover, the heat exchanger cap received in the base.

14. The battery distribution unit of claim 1, wherein each terminal comprises a bus bar having a plate and a button pressed into the plate, the button including an opening receiving a terminating end of a corresponding fixed contact, the plate being manufactured from aluminum, the button being manufactured from copper.

15. The battery distribution unit of claim 1, wherein the housing includes an opening at the bottom, the heat exchanger cap thermally coupled to the battery case of the battery module through the opening.

16. The battery distribution unit of claim 1, wherein
   the contactor housing defines a chamber, the contactor housing having a bottom surface at the bottom end;
   the contactor further comprising a coil assembly in the chamber at the top end of the contactor housing including a coil and a plunger movable based on an operating state of the coil, the plunger being operably coupled to the movable contact to move the movable contact;
   the fixed contacts including a first fixed contact having a mating end and a terminating end, the mating end positioned in the chamber and configured to be engaged by the movable contact, the terminating end extending from the bottom end of the contactor housing for electrical connection with a corresponding terminal;
   the fixed contacts including a second fixed contact having a mating end and a terminating end, the mating end positioned in the chamber and configured to be engaged by the movable contact to close a contactor circuit of the contactor defined by the first fixed contact and the second fixed contact, the terminating end extending from the bottom end of the contactor housing for electrical connection with a corresponding terminal.

17. The battery distribution unit of claim 16, wherein the terminating end of the first fixed contact includes a rivet configured to be riveted to the corresponding terminal, and wherein the terminating end of the second fixed contact includes a rivet configured to be riveted to the corresponding terminal.

18. A battery distribution unit for a battery module comprising:
- a housing including a bottom configured to be mounted to a battery case of the battery module, the housing including a component cavity;
- a circuit component received in the component cavity, the circuit component having a bottom surface facing the bottom of the housing; and
- a heat spreader in thermal communication with the bottom surface of the circuit component, the heat spreader provided at or below the bottom of the housing and configured to be in thermal communication with the battery case of the battery module to create a direct thermal path between the bottom surface of the circuit component and the battery case to dissipate heat from the bottom surface of the circuit component into the battery case of the battery module.

19. The battery distribution unit of claim 18, wherein the circuit component is a contactor having a contactor housing including a top end and a bottom end, the contactor housing defining a chamber, the contactor having a coil assembly in the chamber including a coil and a plunger movable based on an operating state of the coil, the contactor having a movable contact in the chamber coupled to and movable with the plunger, the contactor having fixed contacts held by the contactor housing, each fixed contact having a mating end and a terminating end, the mating end positioned in the chamber and configured to be engaged by the movable contact to close a contactor circuit of the contactor, the terminating end extending from the bottom end of the contactor housing, the contactor received in the component cavity such that the terminating ends of the fixed contacts extend below the bottom end of the contactor housing to define the bottom surface of the circuit component, the heat spreader being in thermal communication with the terminating ends of the fixed contacts to dissipate heat from the terminating ends of the fixed contacts.

20. The battery distribution unit of claim 18, wherein the circuit component is a fuse having a fuse body extending between a first end and a second end, the fuse having a fuse element between the first end and the second end, the fuse having a first fuse contact at the first end and a second fuse contact at the second end, the fuse body including the bottom surface, the heat spreader being in thermal communication with the fuse body to dissipate heat from the fuse body.

21. The battery distribution unit of claim 18, further comprising a thermal interface element between the bottom surface of the circuit component and the heat spreader, the thermal interface element directly engaging the bottom surface and directly engaging the heat spreader.

22. The battery distribution unit of claim 18, wherein the heat spreader is a heat sink plate having a lower surface in direct thermal contact with the battery case of the battery module.

23. The battery distribution unit of claim 18, further comprising a heat exchanger cap coupled to the circuit component, the heat exchanger cap having a cap body electrically isolating the circuit component from the heat spreader, the heat exchanger cap thermally coupling the circuit component to the heat spreader.

24. The battery distribution unit of claim 1, wherein the heat exchanger cap includes a cap body extending between a top and a bottom, the cap body being manufactured from an electrically insulative material, the cap body being thermally conductive, the cap body including a pocket open at a top of the cap body that receives the terminating ends of the fixed contacts, the cap body including a thermal interface surface at the bottom for interfacing with a heat sink, the heat exchanger cap includes a heat spreader received in the pocket of the cap body, the heat spreader including a base and spring fingers extending from the base, the base directly engaging the cap body, the spring fingers directly engaging a corresponding fixed contact, the heat spreader defining direct thermal interfaces between the fixed contacts and the cap body to dissipate heat from the fixed contacts.

25. The battery distribution unit of claim 24, wherein the cap body includes a housing member defining the pocket and a pad received in the pocket of the housing member at the bottom of the cap body, the base of the heat spreader directly engaging the pad.

26. The battery distribution unit of claim 24, wherein the pad is manufactured from a first material and the housing member is manufactured from a second material different than the first material, the first material being more thermally conductive than the second material.

\* \* \* \* \*